under (12) United States Patent Fan et al.

(10) Patent No.: US 8,662,607 B2
(45) Date of Patent: Mar. 4, 2014

(54) SLIDE ASSEMBLY

(75) Inventors: Chen-Lu Fan, New Taipei (TW); Jing-Chao Liang, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/484,437

(22) Filed: May 31, 2012

(65) Prior Publication Data

US 2013/0016930 A1    Jan. 17, 2013

(30) Foreign Application Priority Data

Jul. 13, 2011    (CN) .......................... 2011 1 0195708

(51) Int. Cl.
A47B 95/00    (2006.01)
(52) U.S. Cl.
USPC ..................................... 312/333; 312/334.47
(58) Field of Classification Search
USPC ......... 312/334.44–334.47, 334.1–334.8, 333; 211/26, 192; 248/241, 298.1, 257, 265, 248/269
See application file for complete search history.

(56) References Cited

U.S. PATENT DOCUMENTS

| | | | | |
|---|---|---|---|---|
| 6,585,335 B2 * | 7/2003 | Hwang et al. | | 312/333 |
| 7,857,403 B2 * | 12/2010 | Chen et al. | | 312/334.46 |
| 2002/0158556 A1 * | 10/2002 | Cheng | | 312/333 |
| 2003/0197453 A1 * | 10/2003 | Jurja | | 312/334.46 |
| 2004/0080245 A1 * | 4/2004 | Lammens et al. | | 312/333 |
| 2004/0207300 A1 * | 10/2004 | Chen et al. | | 312/333 |
| 2005/0062379 A1 * | 3/2005 | Judge et al. | | 312/334.46 |
| 2005/0156493 A1 * | 7/2005 | Yang et al. | | 312/334.5 |
| 2005/0180667 A1 * | 8/2005 | Chen et al. | | 384/21 |
| 2005/0274680 A1 * | 12/2005 | Allen et al. | | 211/26 |
| 2006/0120636 A1 * | 6/2006 | Chen et al. | | 384/18 |
| 2007/0164644 A1 * | 7/2007 | Hwang et al. | | 312/333 |
| 2007/0296318 A1 * | 12/2007 | Peng et al. | | 312/334.44 |
| 2008/0053933 A1 * | 3/2008 | Allen et al. | | 211/90.01 |
| 2008/0143224 A1 * | 6/2008 | Huang | | 312/333 |
| 2008/0303398 A1 * | 12/2008 | Hsiung et al. | | 312/334.46 |
| 2009/0166485 A1 * | 7/2009 | Chen et al. | | 248/200 |
| 2009/0169140 A1 * | 7/2009 | Chen et al. | | 384/21 |
| 2010/0194252 A1 * | 8/2010 | Liang | | 312/223.2 |
| 2010/0259146 A1 * | 10/2010 | Chen et al. | | 312/319.1 |
| 2011/0091141 A1 * | 4/2011 | Liang | | 384/20 |
| 2011/0135224 A1 * | 6/2011 | Chen et al. | | 384/26 |
| 2011/0280506 A1 * | 11/2011 | Chen et al. | | 384/10 |
| 2012/0076446 A1 * | 3/2012 | Chen et al. | | 384/21 |
| 2012/0145850 A1 * | 6/2012 | Yu et al. | | 248/220.22 |
| 2012/0257845 A1 * | 10/2012 | Fan et al. | | 384/35 |
| 2012/0312943 A1 * | 12/2012 | Fan | | 248/222.11 |
| 2013/0016928 A1 * | 1/2013 | Chen et al. | | 384/35 |
| 2013/0026113 A1 * | 1/2013 | Fan et al. | | 211/26 |

* cited by examiner

*Primary Examiner* — Darnell Jayne
*Assistant Examiner* — Ryan A Doyle
(74) *Attorney, Agent, or Firm* — Altis Law Group, Inc.

(57) ABSTRACT

A slide assembly includes an outer slide, a middle slide mounted on the outer slide and a first locking slice mounted on the outer slide. A first blocking portion is formed on the first locking slice. A first opening is defined in the outer slide corresponds to the first blocking portion. A first abutting portion is formed on the middle slide corresponds to the first blocking portion. The first blocking portion passes through the first opening to fix the first locking slice on the outer slide. When the middle slide is slid back in the outer slide, the first blocking portion abuts the first abutting portion to prevent the middle slide being slid back in the outer slide.

18 Claims, 7 Drawing Sheets

SLIDE ASSEMBLY

BACKGROUND

1. Technical Field

The present disclosure relates to a slide assembly for protecting an electronic device from shocking impacts.

2. Description of Related Art

Three-section slides for server units include an inner slide, an outer slide, and a third slide. A slide-aiding ball member is sandwiched between any two of the inner slide, the outer slide, and the third slide to enable a smooth sliding movement. The inner slide and the outer slide have a retaining member and a stop member mounted thereon respectively, for restricting movement. The retaining member is attached to an inner surface of the inner slide, and is provided with an engaging portion. The stop member is mounted to a front end of the outer slide, and is provided with a protrusion. When users draw out the inner slide from the outer slide, the protrusion of the stop member engages with the engaging portion of the retaining member to prevent accidentally disassembling of the inner slide form the outer slide.

However, the inner slide may withstand impact forces by the outer slide and the third slide when the user directly disengages the engaging portion from the stop member to let the inner slide retract into the outer slide. Therefore, it may be inconvenient and dangerous for users to operate the slides.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
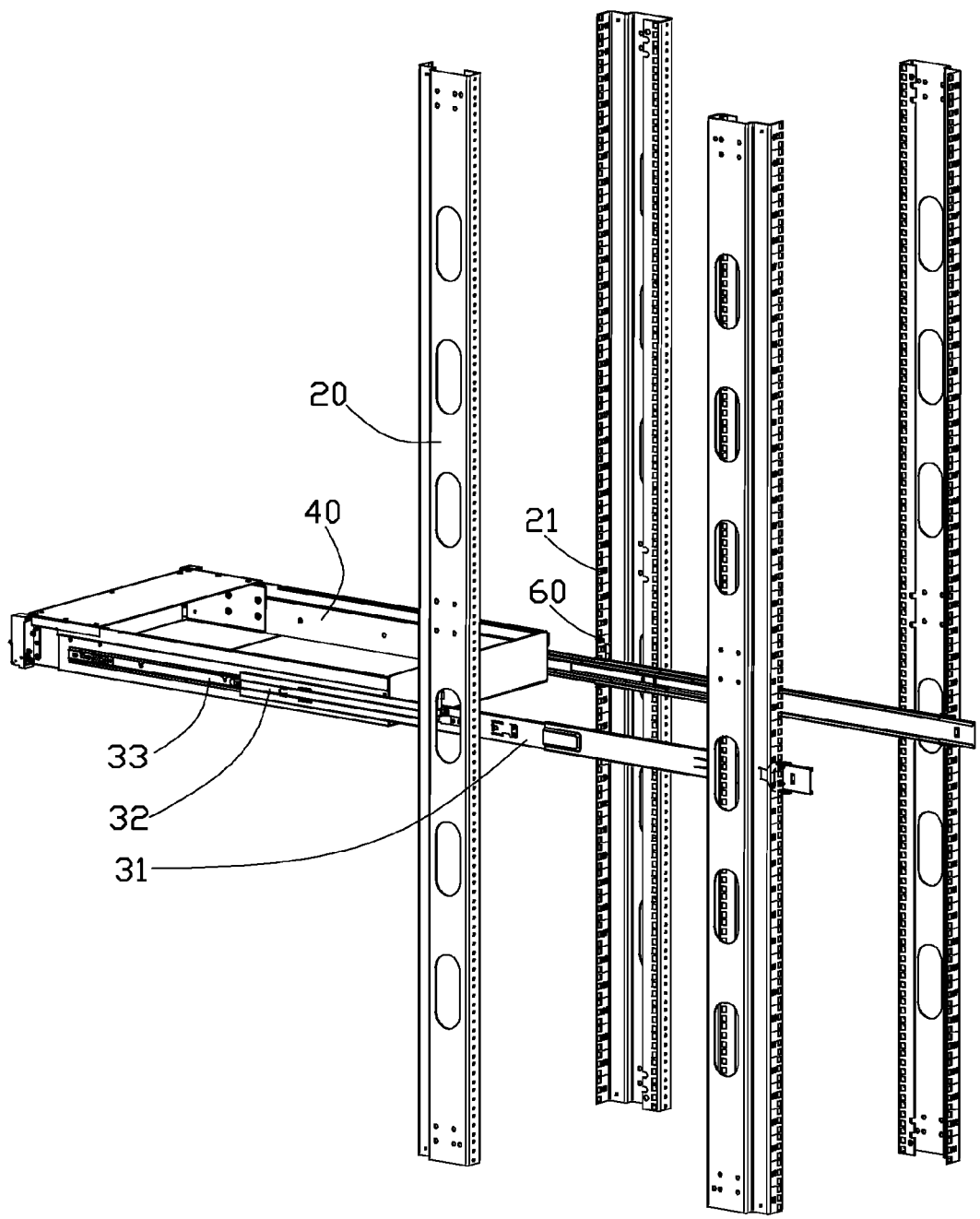
FIG. 1 is an assembly view of an embodiment of a slide assembly for mounting an electronic device, the slide assembly including a locking member, an outer slide, a middle slide, an inner slide and a handle member.
Figure 2:
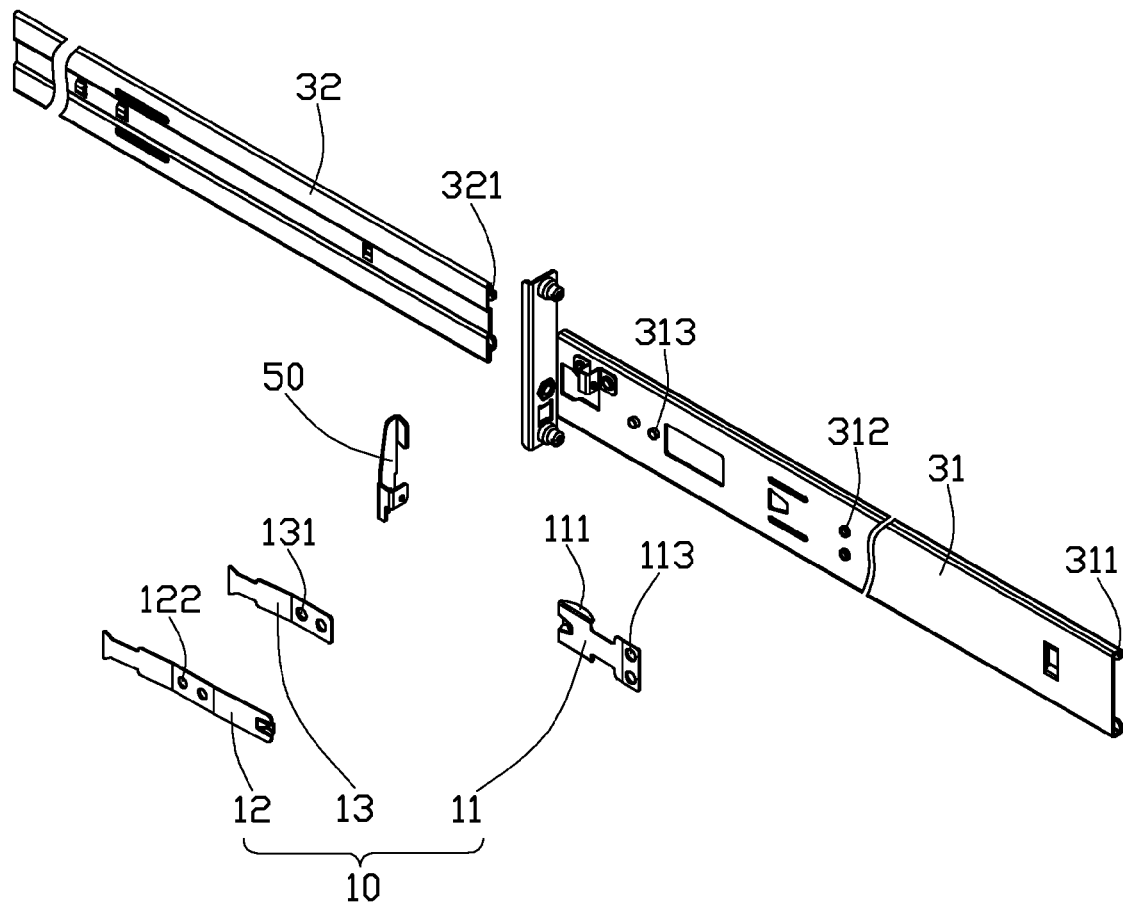
FIG. 2 is an exploded, isometric view of the locking member, the outer slide, the middle slide and the handle member of FIG. 1.
Figure 3:
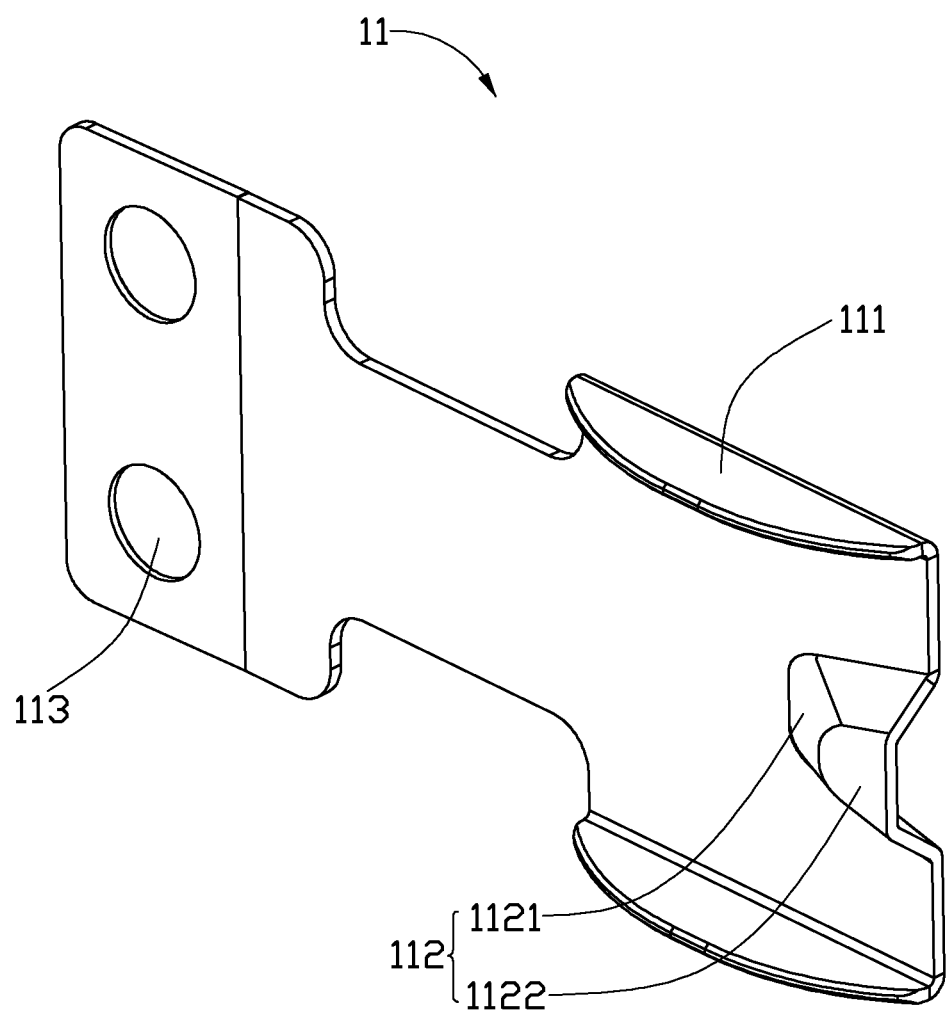
FIG. 3 is an isometric view of the first locking slice of FIG. 2.
Figure 4:
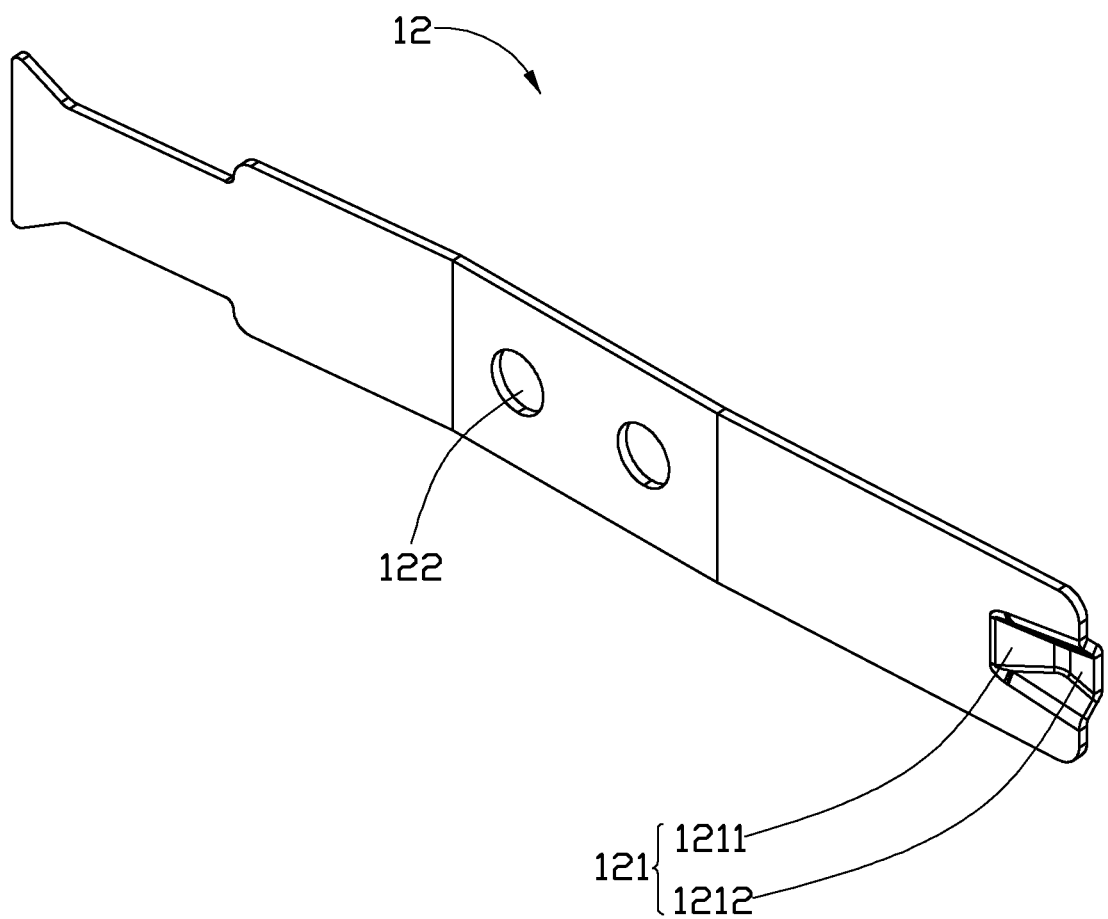
FIG. 4 is an isometric view of the second locking slice of FIG. 2.
Figure 5:
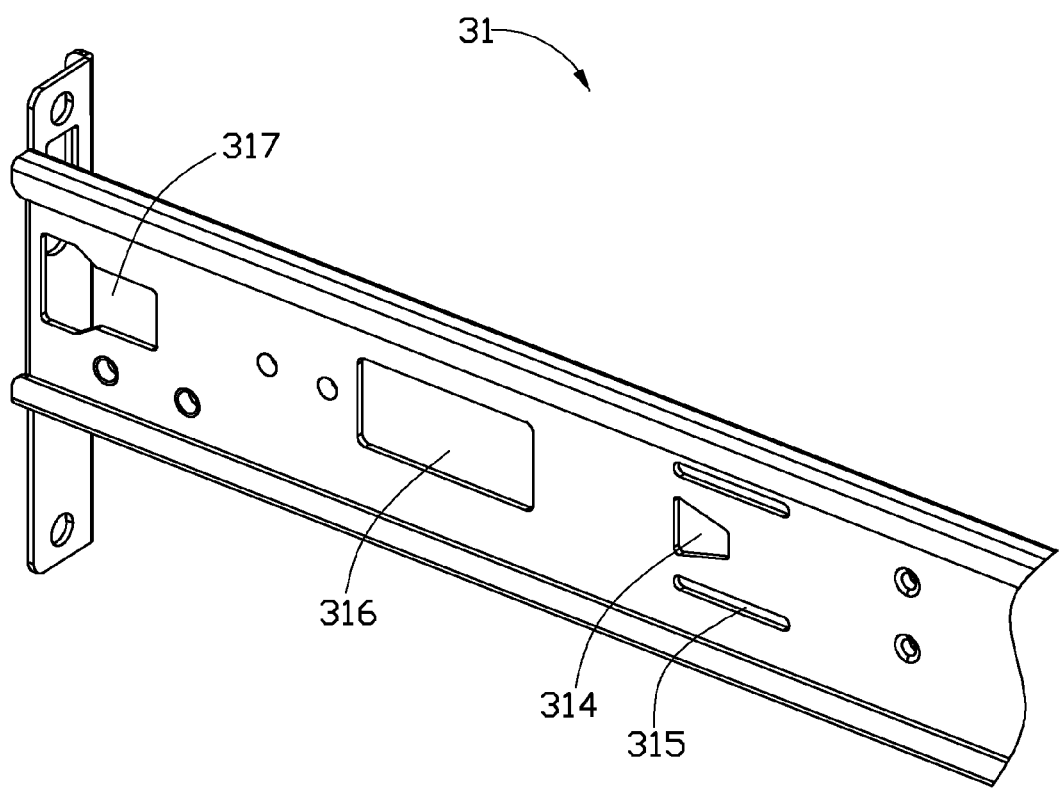
FIG. 5 is an isometric view of the outer slide of FIG. 2.
Figure 6:
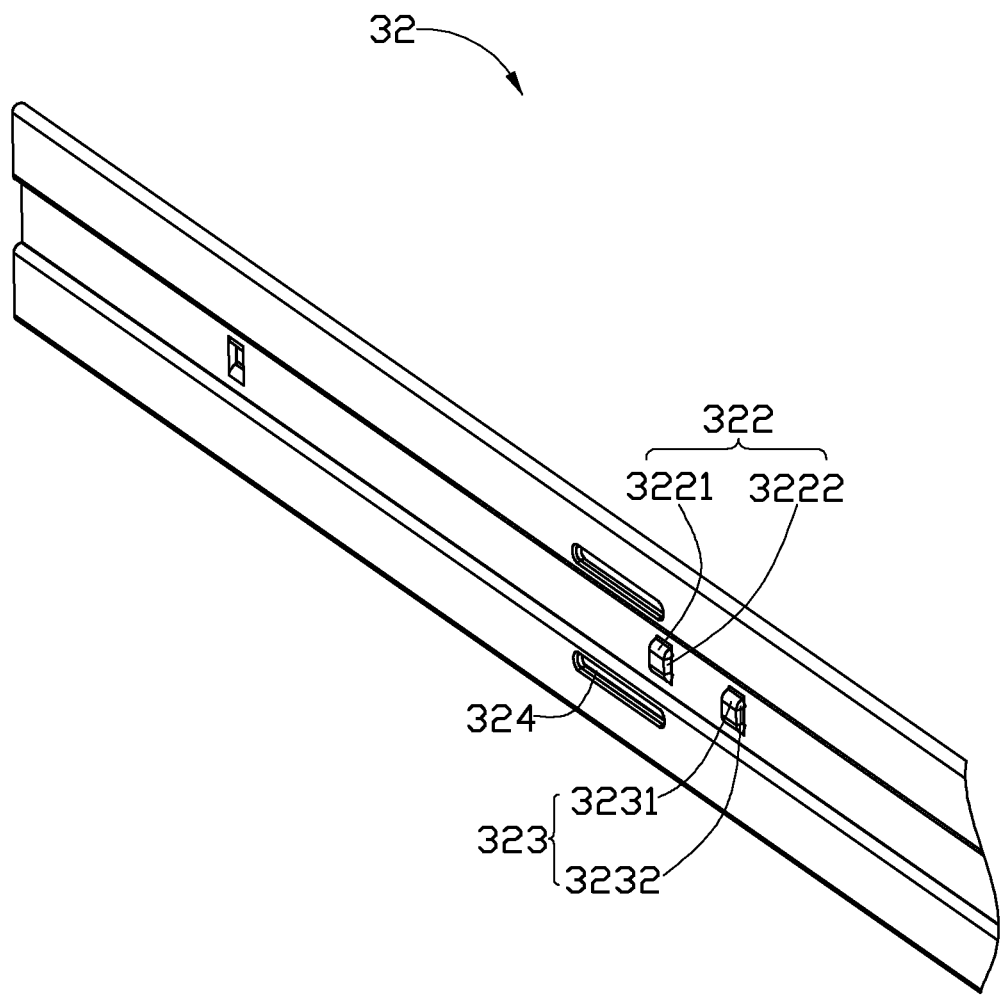
FIG. 6 is an isometric view of the middle slide of FIG. 2.

Referring to FIGS. 1 and 2, a slide assembly in accordance with an embodiment, configured for mounting an electronic device 40, includes a locking member 10, an outer slide 31 mounted on a rack 20, a middle slide 32 mounted on the outer slide 31, an inner slide 33 mounted on the middle slide 32, and a handle member 50 mounted on the outer slide 31.

Referring to FIGS. 2 to 6, the locking member 10 includes a first locking slice 11, a second locking slice 12, and a third locking slice 13. The first locking slice 11 and the second locking slice 12 are mounted on the outer slide 31. The third locking slice 13 is mounted on the second locking slice 12. Two crown-shaped pressing portions 111 perpendicularly extended from two edges on a first end of the first locking slice 11. A trapezoid-shaped first blocking portion 112 is formed on the first locking slice 11 between the two pressing portions 111. The first blocking portion 112 includes three trapezoid-shaped first sidewalls 1121 extended from the first locking slice 11 and a trapezoid-shaped first top wall 1122 connected among the three first sidewalls 1121. Two circular first mounting holes 113 are defined in a second end of the first locking slice 11. In one embodiment, a width in a middle of the first locking slice 11 is less than a width of the first end and the second end of the first locking slice 11.

A trapezoid-shaped second blocking portion 121 is formed on a first end of the second locking slice 12. The second locking slice 12 includes three trapezoid-shaped second sidewalls 1211 extended from the second locking slice 12 and a trapezoid-shaped second top wall 1212 connected among the three second sidewalls 1211. Two circular second mounting holes 122 are defined in a middle of the second locking slice 12. A second end of the second locking slice 12 is bent and tilted slightly. Two circular third mounting holes 131 are defined in a first end of the third locking slice 13. A second end of the third locking slice 13 is bent and tilted slightly. In one embodiment, the second locking slice 12 and the third locking slice 13 are elastic slices. A width of the second end of the second locking slice 12 is less than a width of the first end of the second locking slice 12. A width of the second end of the third locking slice 13 is less than a width of the first end of the third locking slice 13.

Two side edges of the outer slide 31 bent to form a first fixing slot 311 for receiving the middle slide 32. Two column-shaped first mounting portions 312 are formed in the first fixing slot 311 correspond to the two first mounting holes 113. Two column-shaped second mounting portions 313 are formed in the first fixing slot 311 corresponding to the two second mounting holes 122 and the two third mounting holes 131. A trapezoid-shaped first opening 314 is defined in the first fixing slot 311 between the first mounting portions 312 and the second mounting portions 313 corresponding to the first blocking portion 112. Two rod-shaped first connecting slots 315 are defined in the first fixing slot 311 besides the first opening 314 corresponding to the two pressing portions 111. A rod-shaped second opening 316 is defined in the first fixing slot 311 between the second mounting portions 313 and the first opening 314 corresponding to the first end of the second locking slice 12. A rod-shaped third opening 317 is defined in the first fixing slot 311 adjacent to the second mounting portions 313 corresponding to the second end of the second locking slice 12.

Two side edges of the middle slide 32 bent to form a second fixing slot 321 for receiving the inner slide 33. A trapezoid-shaped first abutting portion 322 is formed on the middle slide 32 corresponds to the first blocking portion 112. The first abutting portion 322 includes two rod-shaped first supporting arms 3221 extended from the middle slide 32 and a rod-shaped first connecting arm 3222 connected between the two first supporting arms 3221. A trapezoid-shaped second abutting portion 323 is formed on the middle slide 32 adjacent to the first abutting portion 322 corresponds to the second blocking portion 121. The second abutting portion 323 includes two rod-shaped second supporting arms 3231 extended from the middle slide 32 and a rod-shaped second connecting arm 3232 connected between the two second supporting arms 3231. Two rod-shaped second connecting slots 324 are defined on two sides of the first abutting portion 322 correspond to the two pressing portions 111. In one embodiment, the first connecting arm 3222 and the second connecting arm 3232 are parallel to a plane of the middle slide 32.

Figure 7:
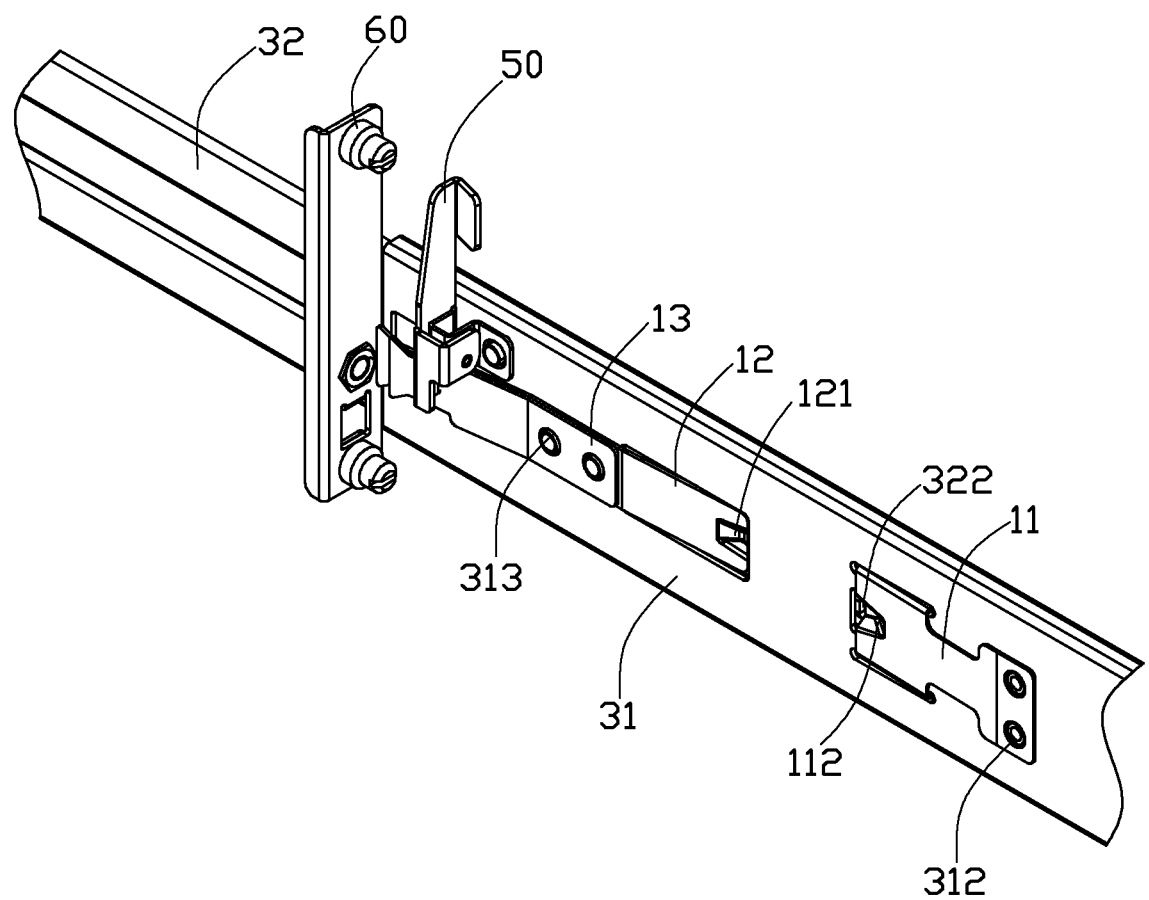
FIG. 7 is an assembly view of FIG. 2.

Referring to FIG. 7, in assembly, the two pressing portions 111 are passed through the two first connecting slots 315. The first blocking portion 112 is passed through the first opening 314. The two first mounting portions 312 are passed through the two first mounting holes 113 to mount the first locking slice 11 on the outer slide 31. The first end of the second locking slice 12 is passed through the second opening 316. The two second mounting portions 313 are passed through the two second mounting holes 122 to mount the second locking slice 12 on the outer slide 31. The two second mounting portions 313 are passed through the two third mounting holes 131 to mount the third locking slice 13 on the second locking slice 12. The second end of the second locking slice 12 and the second end of the third locking slice 13 align with the third opening 317.

The middle slide 32 is received in the first fixing slot 311. The inner slide 33 is received in the second fixing slot 321. Thus, the locking member 10, the middle slide 32, and the inner slide 33 on mounted on the outer slide 31. Two fastening members 60 are mounted on the outer slide 31. Two rectangular locating holes 21 are defined on the rack 20 correspond to the two fastening members 60. The fastening members 60 are passed through the two locating holes 21 to mount the outer slide 31 on the rack 20. The second end of the second locking slice 12 tilted to abut the rack 20. The fastening members 60 are restricted in the locating holes 21. The outer slide 31 is fixed on the rack 20. The handle member 50 is pivotally mounted on the outer slide 31. A lower portion of the handle member 50 abuts the second end of the third locking slice 13. An upper portion of the handle member 50 is pressed to rotate clockwise. The lower portion of the handle member 50 abuts the second ends of the second locking slice 12 and the third locking slice 13 to move toward the third opening 317. The second ends of the second locking slice 12 and the third locking slice 13 does not abut the rack 20. The fastening members 60 are moved out from the locating holes 21 to remove the outer slide 31 from the rack 20.

When the electronic device 40 is slid out from the inner slide 33, the middle slide 32 and the inner slide 33 slides out of the rack 20 sequentially. Opposite two of the second sidewalls 1211 of the second blocking portion 121 abut the second supporting arms 3231 of the second abutting portion 323 to prevent the middle slide 32 being slid out of the rack 20 continuously. The two pressing portions 111 pass through the two second connecting slots 324. Two opposite of the first sidewalls 1121 of the first blocking portion 112 abut the first supporting arms 3221 of the first abutting portion 322 to prevent the middle slide 32 being slid back in the rack 20.

When the electronic device 40 is slid back in the rack 20, the inner slide 33 and the middle slide 32 slides back in the rack 20 sequentially. A first end of the inner slide 33 abuts the pressing portions 111 of the first locking slice 11. The first blocking portion 112 of the first locking slice 11 moves out of the first opening 314. Opposite two of the first sidewalls 1121 of the first blocking portion 112 do not abut the first supporting arms 3221 of the first abutting portion 322. The middle slide 32 is slid back in the rack 20.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A slide assembly, comprising:
    an outer slide;
    a middle slide mounted on the outer slide; and
    a first locking slice mounted on the outer slide; wherein two pressing portions extended from a first end of the first locking slice; a first blocking portion is formed on the first locking slice between the two pressing portions; a first opening is defined in the outer slide, the first opening corresponding to the first blocking portion; two first connecting slots are defined in the outer slide besides the first opening, each of the two first connecting slots corresponding to each of the two pressing portions; a first abutting portion is formed on the middle slide, the first abutting portion corresponding to the first blocking portion; the first blocking portion passes through the first opening; each of the two pressing portions passes through each of the two first connecting slots to fix the first locking slice on the outer slide; and when the middle slide is slid back in the outer slide, the first blocking portion abuts the first abutting portion to prevent the middle slide from being slid back in the outer slide; the first blocking portion comprises three trapezoid-shaped first sidewalls extended from the first locking slice and a trapezoid-shaped first top wall connected to each of the three first sidewalls; the first abutting portion comprises two rod-shaped first supporting arms extended from the middle slide and a rod-shaped first connecting arm connected between the two first supporting arms; and each of the two first supporting arms abuts each opposite two of the three first sidewalls when the first blocking portion abuts the first abutting portion.

2. The slide assembly of claim 1, wherein two first mounting holes are defined in a second end of the first locking slice; two first mounting portions are formed on the outer slide, each of the two first mounting portions corresponding to each of the two first mounting holes; and each of the two first mounting portions passes through each of the two first mounting holes to fix the first locking slice on the outer slide.

3. The slide assembly of claim 1, further comprising a second locking slice mounted on the outer slide; a second blocking portion is formed on a first end of the second locking slice; a second abutting portion is formed on the middle slide adjacent to the first abutting portion, the second abutting portion corresponding to the second blocking portion; and when the middle slide is slid out of the outer slide, the second blocking portion abuts the second abutting portion to prevent the middle slide from being slid out of the outer slide.

4. The slide assembly of claim 3, wherein two second mounting holes are defined in a middle of the second locking slice; two second mounting portions are formed on the outer slide, each of the two second mounting portions corresponding to each of the two second mounting holes; and each of the two second mounting portions passes through each of the two second mounting holes to fix the second locking slice on the outer slide.

5. The slide assembly of claim 4, further comprising a third locking slice mounted on the second locking slice; two third mounting holes are defined in a first end of the third locking slice; and each of the two second mounting portions passes through each of the two third mounting holes to fix the third locking slice on the second locking slice.

6. The slide assembly of claim 5, wherein a handle member is pivotally mounted on the outer slide; the second locking slice and the third locking slice are elastic slices; a second end of the second locking slice and a second end of the third locking slice are bent and tilted; a lower portion of the handle member abuts the second end of the third locking slice; a second opening is defined on the outer slide, the second opening corresponding to the first end of the second locking slice; and a third opening is defined on the outer slide, the third opening corresponding to the second end of the third locking slice.

7. The slide assembly of claim 6, wherein two fastening members are mounted on the outer slide; two locating holes are defined on a rack, each of the two locating holes corresponding to each of the two fastening members; each of the two fastening members passes through each of the two locating holes to mount the outer slide on the rack; and the second end of the second locking slice is tilted to abut the rack.

8. The slide assembly of claim 7, wherein when an upper portion of the handle member is pressed to rotate clockwise, the lower portion of the handle member abuts the second end of the second locking slice and the second end of the third locking slice to move toward the third opening; the second end of the second locking slice and the second end of the third locking slice do not abut the rack; and each of the two fastening members is being moved out from each of the two locating holes to remove the outer slide from the rack.

9. The slide assembly of claim 8, wherein a width in a middle of the first locking slice is less than a width of the first end and a width of the second end of the first locking slice; a width of the second end of the second locking slice is less than a width of the first end of the second locking slice; and a width of the second end of the third locking slice is less than a width of the first end of the third locking slice.

10. A slide assembly, comprising:
an outer slide;
a middle slide mounted on the outer slide;
a first locking slice mounted on the outer slide; wherein a first blocking portion is formed on the first locking slice; a first opening is defined in the outer slide, the first opening corresponding to the first blocking portion; a first abutting portion is formed on the middle slide, the first abutting portion corresponding to the first blocking portion; the first blocking portion passes through the first opening to fix the first locking slice on the outer slide; and
a second locking slice mounted on the outer slide; wherein a second blocking portion is formed on a first end of the second locking slice; a second abutting portion is formed on the middle slide adjacent to the first abutting portion, the second abutting portion corresponding to the second blocking portion;
wherein when the middle slide is slid back in the outer slide, the first blocking portion abuts the first abutting portion to prevent the middle slide from being slid back in the outer slide; and when the middle slide is slid out of the outer slide, the second blocking portion abuts the second abutting portion to prevent the middle slide from being slid out of the outer slide; two pressing portions extended from a first end of the first locking slice; two first connecting slots are defined in the outer slide besides the first opening, each of the two first connecting slots corresponding to each of the two pressing portions; each of the two pressing portions passes through each of the two first connecting slots to fix the first locking slice on the outer slide; the first blocking portion comprises three trapezoid-shaped first sidewalls extended from the first locking slice and a trapezoid-shaped first top wall connected to each of the three first sidewalls; the first abutting portion comprises two rod-shaped first supporting arms extended from the middle slide and a rod-shaped first connecting arm connected between the two first supporting arms; and each of the two first supporting arms abut each opposite two of the three first sidewalls when the first blocking portion abuts the first abutting portion.

11. The slide assembly of claim 10, wherein two first mounting holes are defined in a second end of the first locking slice; two first mounting portions are formed on the outer slide, each of the two first mounting portion corresponding to each of the two first mounting holes; and each of the two first mounting portions passes through each of the two first mounting holes to fix the first locking slice on the outer slide.

12. The slide assembly of claim 11, wherein two second mounting holes are defined in a middle of the second locking slice; two second mounting portions are formed on the outer slide, each of the two second mounting portions corresponding to each of the two second mounting holes; and each of the two second mounting portions passes through each of the two second mounting holes to fix the second locking slice on the outer slide.

13. The slide assembly of claim 12, further comprising a third locking slice mounted on the second locking slice; two third mounting holes are defined in a first end of the third locking slice; and each of the two second mounting portions passes through each of the two third mounting holes to fix the third locking slice on the second locking slice.

14. The slide assembly of claim 13, wherein a handle member is pivotally mounted on the outer slide; the second locking slice and the third locking slice are elastic slices; a second end of the second locking slice and a second end of the third locking slice are bent and tilted; a lower portion of the handle member abuts the second end of the third locking slice; a second opening is defined on the outer slide, the second opening corresponding to the first end of the second locking slice; and a third opening is defined on the outer slide, the third opening corresponding to the second end of the third locking slice.

15. The slide assembly of claim 14, wherein two fastening members are mounted on the outer slide; two locating holes are defined on a rack, each of the two locating holes corresponding to each of the fastening members; each of the two fastening members passes through each of the two locating holes to mount the outer slide on the rack; and the second end of the second locking slice is tilted to abut the rack.

16. The slide assembly of claim 15, wherein when an upper portion of the handle member is pressed to rotate clockwise, the lower portion of the handle member abuts the second end of the second locking slice and the second end of the third locking slice to move toward the third opening; the second end of the second locking slice and the second end of the third locking slice do not abut the rack; and each of the two fastening members is being moved out from each of the two locating holes to remove the outer slide from the rack.

17. The slide assembly of claim 16, wherein a width in a middle of the first locking slice is less than a width of the first end and a width of the second end of the first locking slice; a width of the second end of the second locking slice is less than a width of the first end of the second locking slice; and a width of the second end of the third locking slice is less than a width of the first end of the third locking slice.

18. A slide assembly, comprising:
an outer slide;
a middle slide mounted on the outer slide;

a first locking slice mounted on the outer slide; wherein two pressing portions extend from a first end of the first locking slice; a first blocking portion is formed on the first locking slice between the two pressing portions; a first opening is defined in the outer slide, the first opening corresponds to the first blocking portion; two first connecting slots are defined in the outer slide beside the first opening, each of the two first connecting slots corresponding to each of the two pressing portions; a first abutting portion is formed on the middle slide, the first abutting portion corresponds to the first blocking portion; the first blocking portion passes through the first opening; each of the two pressing portions passes through each of the two first connecting slots to fix the first locking slice on the outer slide; and when the middle slide is slid back in the outer slide, the first blocking portion abuts the first abutting portion to prevent the middle slide from being slid back in the outer slide;

a second locking slice mounted on the outer slide; a second blocking portion is formed on a first end of the second locking slice; a second abutting portion is formed on the middle slide adjacent to the first abutting portion, the second abutting portion corresponds to the second blocking portion; and when the middle slide is slid out of the outer slide, the second blocking portion abuts the second abutting portion to prevent the middle slide from being slid out of the outer slide; wherein two second mounting holes are defined in a middle of the second locking slice; two second mounting portions are formed on the outer slide, each of the two second mounting portions correspond to each of the two second mounting holes; and each of the two second mounting portions passes through each of the two second mounting holes to fix the second locking slice on the outer slide; and a third locking slice mounted on the second locking slice; two third mounting holes are defined in a first end of the third locking slice; and each of the two second mounting portions passes through each of the two third mounting holes to fix the third locking slice on the second locking slice.

* * * * *